(12) United States Patent
Kosaka et al.

(10) Patent No.: US 10,943,821 B2
(45) Date of Patent: Mar. 9, 2021

(54) METHOD OF MANUFACTURING SEMICONDUCTOR DEVICE

(71) Applicant: Sumitomo Electric Device Innovations, Inc., Yokohama (JP)

(72) Inventors: Toshiyuki Kosaka, Yokohama (JP); Haruo Kawata, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/521,936

(22) Filed: Jul. 25, 2019

(65) Prior Publication Data

US 2020/0035551 A1 Jan. 30, 2020

(30) Foreign Application Priority Data

Jul. 26, 2018 (JP) .............................. JP2018-140011

(51) Int. Cl.
*H01L 21/00* (2006.01)
*H01L 21/768* (2006.01)
(Continued)

(52) U.S. Cl.
CPC .. *H01L 21/76843* (2013.01); *H01L 21/02378* (2013.01); *H01L 21/02642* (2013.01); *H01L 21/0332* (2013.01); *H01L 21/76816* (2013.01); *H01L 21/76829* (2013.01); *H01L 21/76898* (2013.01); *H01L 22/12* (2013.01)

(58) Field of Classification Search
CPC ......... H01L 21/02378; H01L 21/76843; H01L 21/76816; H01L 21/02642; H01L 21/76898; H01L 21/76829; H01L 21/30621; H01L 21/3065; H01L 21/0332; H01L 22/26; H01L 22/12; H01L 22/34;
(Continued)

(56) References Cited

U.S. PATENT DOCUMENTS 6,646,346 B1 * 11/2003 Snyder .............. H01L 21/32051
257/750
6,831,000 B2 * 12/2004 Murayama ........ H01L 21/76898
257/E21.508

(Continued)

FOREIGN PATENT DOCUMENTS

JP 2009-212103 9/2009

*Primary Examiner* — Nikolay K Yushin
(74) *Attorney, Agent, or Firm* — Smith, Gambrell & Russell, LLP.

(57) ABSTRACT

A method of manufacturing a semiconductor device includes: forming a metal film containing Al on a surface of a substrate product including a substrate and a nitride semiconductor layer on the substrate, the metal film covering a via hole forming predetermined region, and the surface of the substrate product being located on the nitride semiconductor layer side, forming an etching mask having an opening for exposing the via hole forming predetermined region on a back surface of the substrate product, the back surface of the substrate product being located on the substrate side, and forming a via hole in the substrate product by reactive ion etching, the via hole reaching the surface from the back surface and exposing the metal film. In the forming of the via hole, a reaction gas containing fluorine is used during a period at least including a termination of etching.

9 Claims, 11 Drawing Sheets

(51) Int. Cl.
*H01L 21/033* (2006.01)
*H01L 21/02* (2006.01)
*H01L 21/66* (2006.01)

(58) Field of Classification Search
CPC ........... H01L 29/66462; H01L 29/4175; H01L 29/786; H01L 29/0657
See application file for complete search history.

(56) References Cited

U.S. PATENT DOCUMENTS

| | | | | |
|---|---|---|---|---|
| 7,713,863 | B2* | 5/2010 | Sakata | H01L 21/76808 257/E21.585 |
| 8,563,404 | B2* | 10/2013 | Kosaka | H01L 21/78 257/620 |
| 9,136,396 | B2* | 9/2015 | Ko | H01L 29/808 |
| 2004/0137661 | A1* | 7/2004 | Murayama | H01L 25/50 438/106 |
| 2008/0318409 | A1* | 12/2008 | Sakata | H01L 21/76826 438/623 |
| 2012/0025207 | A1* | 2/2012 | Kosaka | H01L 21/78 257/77 |
| 2014/0159049 | A1* | 6/2014 | Ko | H01L 21/76898 257/76 |

* cited by examiner

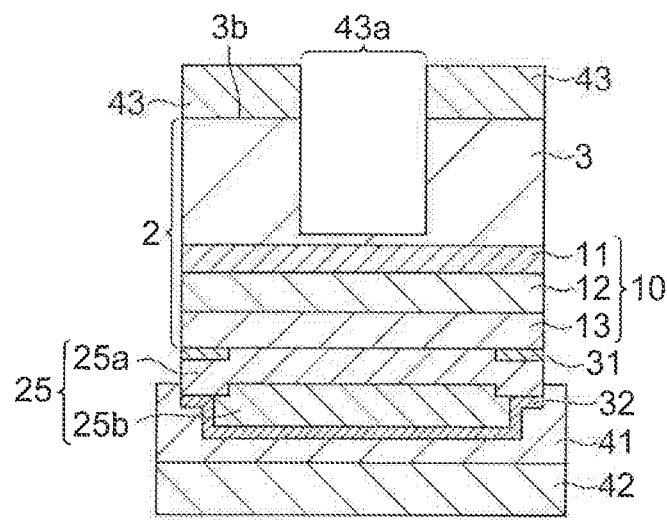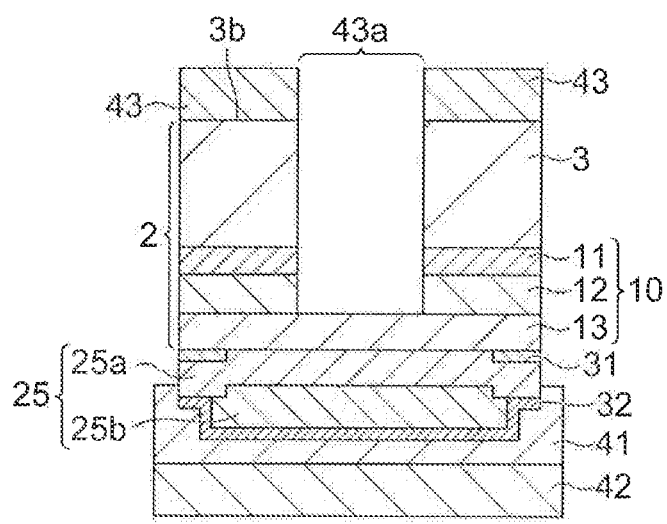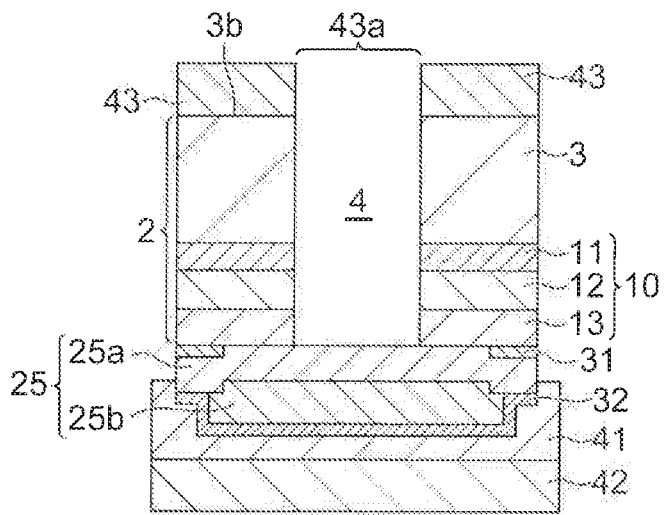

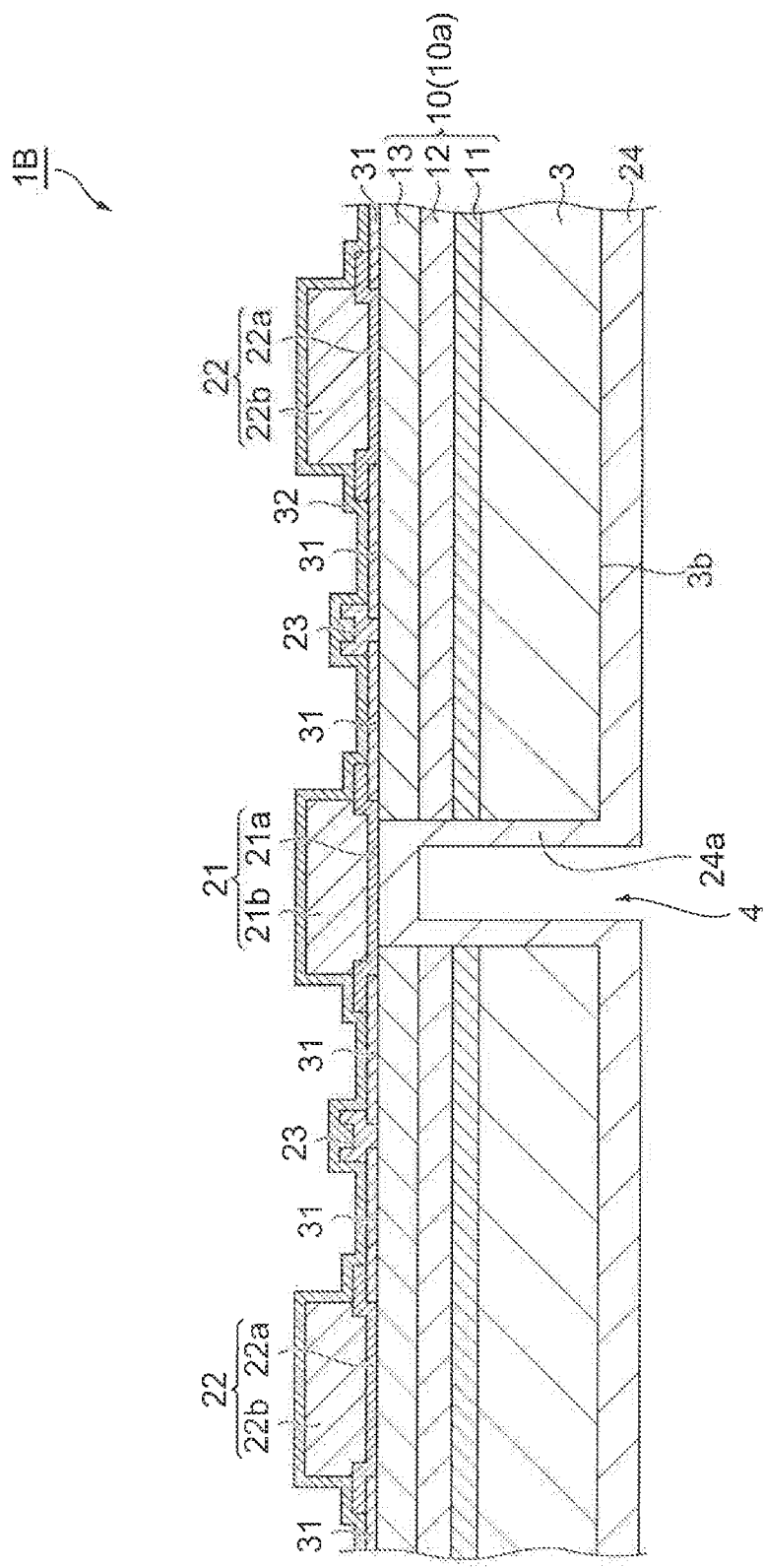

METHOD OF MANUFACTURING SEMICONDUCTOR DEVICE

CROSS REFERENCE TO RELATED APPLICATIONS

This application claims the priority benefit of Japanese Application No. JP2018-140011 filed on Jul. 26, 2018, the entire contents of which are incorporated herein by references.

TECHNICAL FIELD

The present disclosure relates to a method of manufacturing a semiconductor device.

BACKGROUND

Japanese Unexamined Patent Publication No. 2009-212103 discloses a method of manufacturing a semiconductor device. In such a method of manufacturing a semiconductor device, openings reaching a surface of an insulating substrate are formed in a GaN layer and an n-type AlGaN layer. A Ni layer connected to a source electrode is formed in the opening as a conductive etching stopper. A via hole reaching the Ni layer from a back surface of the insulating substrate is formed in the insulating substrate. In addition, a via wire is formed in the via hole.

When a semiconductor device having a nitride semiconductor layer is manufactured on a substrate, a via hole penetrating through the substrate and the nitride semiconductor layer may be formed. In this case, a metal film is first formed as an etching stopper on the nitride semiconductor layer. Subsequently, a via hole is formed from the back surface of the substrate to the metal film by reactive ion etching (RIE). In the RIE for the nitride semiconductor layer, for example, chlorine-based gas is used as reaction gas. As a material of the metal film, Ni having sufficient etching resistance against chlorine plasma can be used. However, the Ni film has a disadvantage of high electrical resistance. In many cases, the metal film is conducted through a back electrode and the via hole. Therefore, it is preferable that the electrical resistance of the metal film is low.

SUMMARY

A method of manufacturing a semiconductor device according to an embodiment of the present disclosure includes forming a metal film containing Al on a surface of a substrate product including a substrate and a nitride semiconductor layer provided on the substrate, the metal film covering a via hole forming predetermined region in the substrate product, and the surface of the substrate product being located on the nitride semiconductor layer side; forming an etching mask having an opening for exposing the via hole forming predetermined region on a back surface of the substrate product, the back surface of the substrate product being located on the substrate side; and forming a via hole in the substrate product by reactive ion etching, the via hole reaching the surface from the back surface and exposing the metal film. In the forming the via hole, a reaction gas containing fluorine is used during a period at least including a termination of etching.

BRIEF DESCRIPTION OF THE DRAWINGS

The foregoing and other purposes, aspects and advantages will be better understood from the following detailed description of a preferred embodiment of the disclosure with reference to the drawings, in which:

FIGS. 8A to 8C are cross-sectional views showing a manufacturing process according to a first modified example;

FIG. 10 is a cross-sectional view taken along the line X-X of the transistor 1B shown in FIG. 9.

DETAILED DESCRIPTION

Figure 1:
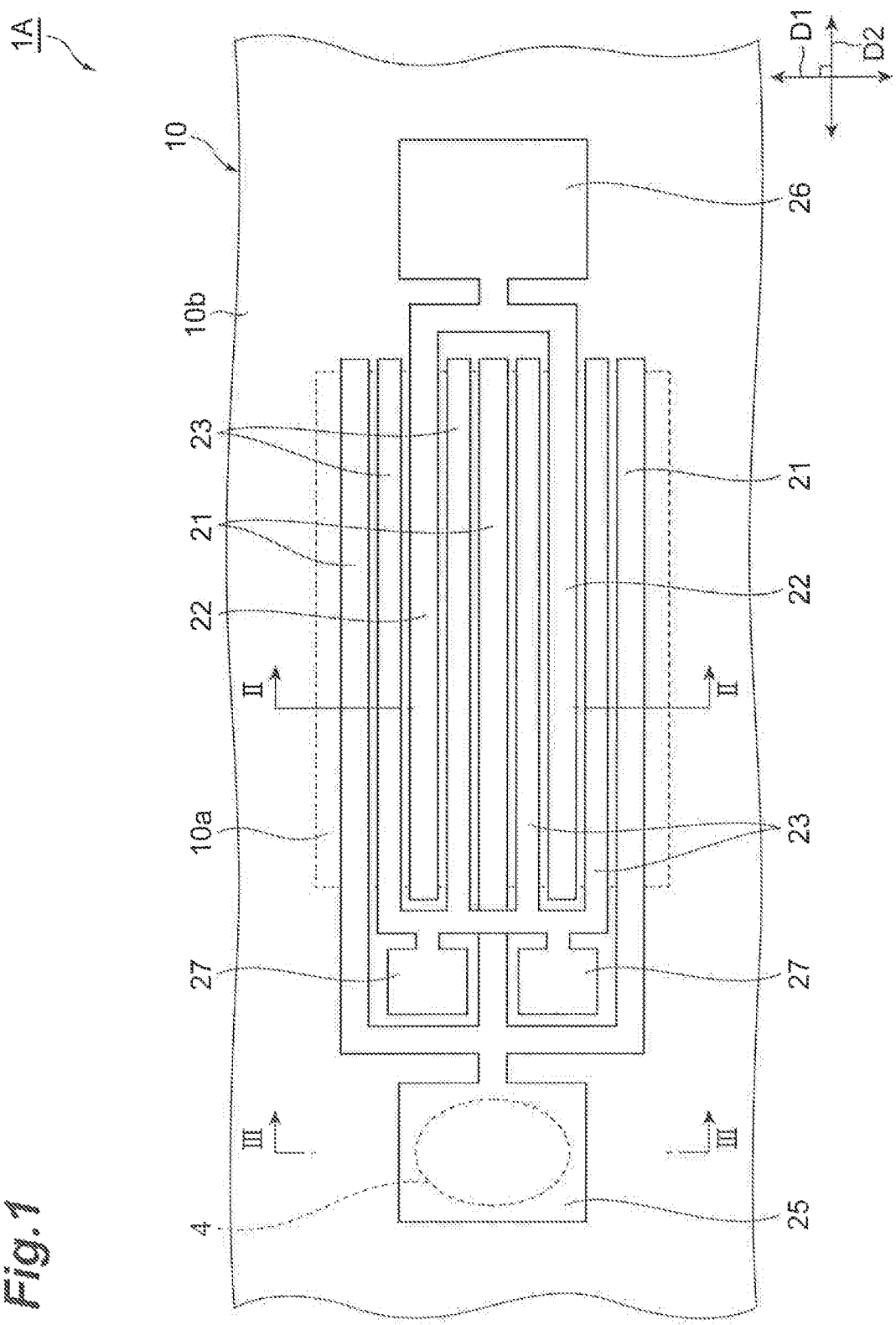
FIG. 1 is a plan view showing a transistor 1A as a semiconductor device according to one embodiment of the present disclosure.

Specific examples of a method of manufacturing a semiconductor device according to an embodiment of the present disclosure will be described below with reference to the drawings. Further, it is to be understood that the present disclosure is not limited to these examples but is defined by the scope of the claims and includes all modifications within the meaning and scope equivalent to the claims. In the following description, the same elements are denoted by the same reference numerals in the description of the drawings, and redundant explanations are omitted.

Figure 2:
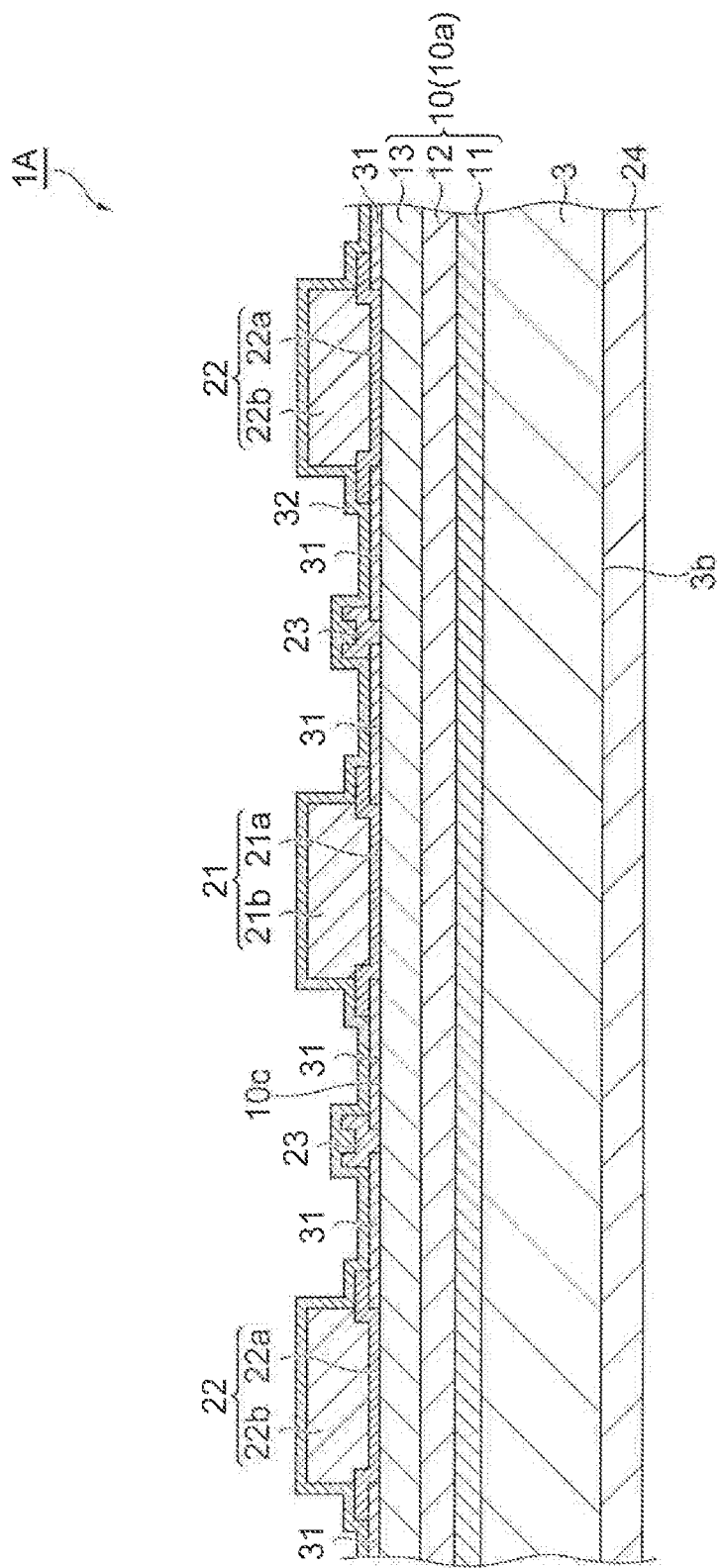
FIG. 2 is a cross-sectional view taken along the line II-II of the transistor 1A shown in FIG. 1.
Figure 3:
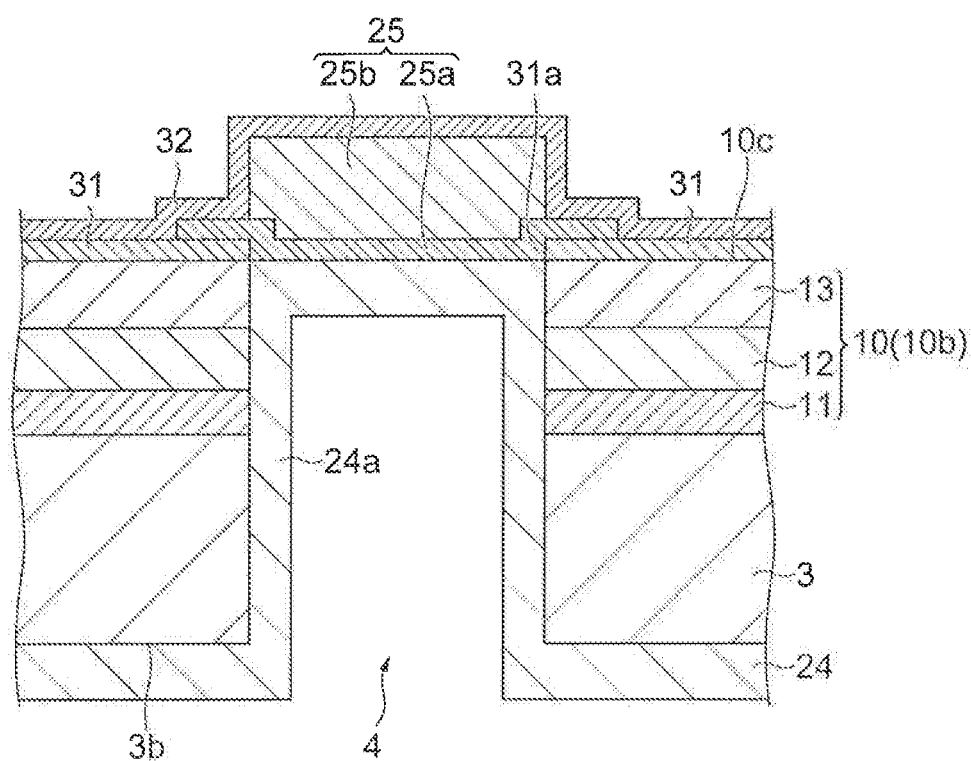
FIG. 3 is a cross-sectional view taken along the line III-III of the transistor 1A shown in FIG. 1.

FIG. 1 is a plan view showing a transistor 1A as a semiconductor device according to one embodiment of the present disclosure. FIG. 2 is a cross-sectional view taken along the line II-II of the transistor 1A shown in FIG. 1. FIG. 3 is a cross-sectional view taken along the line III-III of the transistor 1A shown in FIG. 1. For the sake of explanation, insulating films 31 and 32 are omitted in FIG. 1.

As shown in FIGS. 1 and 2, a transistor 1A according to the present embodiment includes a substrate 3, a nitride semiconductor layer 10 provided on the substrate 3, a source electrode 21, a drain electrode 22, and a gate electrode 23. The source electrode 21, the drain electrode 22 and the gate electrode 23 are provided on the nitride semiconductor layer 10. The substrate 3 is a substrate for crystal growth and has a flat surface. The substrate 3 may be, for example, a SiC substrate. The thickness of the substrate 3 is, for example, in the range of 75 μm to 150 μm, and in one example, 100 μm. The thickness of the nitride semiconductor layer 10 is, for example, in the range of 0.5 μm to 3.0 μm, and in one example, 1.0 μm.

The transistor 1A according to the present embodiment is a high electron mobility transistor (HEMT). That is, the nitride semiconductor layer 10 has at least a channel layer 12 and an electron supply layer (barrier layer) 13. A twodimensional electron gas (2DEG) is generated at an interface between the channel layer 12 and the electron supply layer 13, and a channel region is formed. The channel layer 12 is a layer epitaxially grown on a surface of the substrate 3. A buffer layer 11 may be interposed between the channel layer 12 and the substrate 3. A region in the channel layer 12 and near the interface between the electron supply layer 13 and the channel layer 12 functions as the channel region. The buffer layer 11 is, for example, an AlN layer. A thickness of the buffer layer 11 is, for example, 20 nm. The channel layer 12 is, for example, a GaN layer. A thickness of the channel layer 12 is, for example, 1 μm. The electron supply layer 13 is a layer epitaxially grown on the channel layer 12. A thickness of the electron supply layer 13 is, for example, 20 nm. The electron supply layer 13 is, for example, an AlGaN layer, an InAlN layer, or an InAlGaN layer. In an example, the electron supply layer 13 is made of $Al_{0.25}Ga_{0.75}N$. The electron supply layer 13 may be n-type. Further, the nitride semiconductor layer 10 may further have a cap layer (not shown) on the electron supply layer 13. In this case, a thickness of the cap layer is, for example, 5 nm. The cap layer is, for example, a GaN layer, and may be an n-type.

As shown in FIG. 1, the nitride semiconductor layer 10 has an active region 10a and an inactive region 10b. The active region 10a is a region operating as a transistor. The inactive region 10b is a region electrically inactivated by injecting ions such as argon (Ar) and protons (H) into the nitride semiconductor layer 10, for example. The inactive region 10b surrounds the active region 10a, and is provided for electrical separation between the transistors 1A adjacent to each other and for limiting an operating region of the transistor 1A.

The source electrode 21 and the drain electrode 22 are provided on the active region 10a of the nitride semiconductor layer 10 and are in contact with the active region 10a. In the present embodiment, three source electrodes 21 and two drain electrodes 22 are provided on one active region 10a. The source electrode 21 and the drain electrode 22 are aligned along a direction D1, and each have an elongated shape in which a direction D2 that intersects (e.g., orthogonal to) the direction D1 is a longitudinal direction. As shown in FIG. 2, the source electrode 21 includes an ohmic metal layer 21a provided on the active region 10a and a wiring layer 21b provided on the ohmic metal layer 21a. Similarly, the drain electrode 22 includes an ohmic metal layer 22a provided on the active region 10a and a wiring layer 22b provided on the ohmic metal layer 22a. The ohmic metal layers 21a and 22a are formed by alloying a laminated structure of a first layer, which is a titanium (Ti) layer or a tantalum (Ta) layer, and a second layer, which is an aluminum (Al) layer, by a heat treatment. The Al layer before the heat treatment may be sandwiched by the Ti layer or the Ta layer in a thickness direction of the nitride semiconductor layer 10. A thickness of the Ti layer or the Ta layer is in the range of 5 nm to 20 nm, for example, 10 nm in one embodiment. A thickness of the Al layer is in the range of 50 nm to 1000 nm, for example, 500 nm in one embodiment. The wiring layers 21b and 22b are conductive metal layers having small electric resistance. The wiring layers 21b and 22b are formed by, for example, Au plating and have a thickness of, for example, 5 μm.

The source electrode 21 and the drain electrode 22 may be in contact with the electron supply layer 13 or may be in contact with the cap layer provided on the electron supply layer 13. Alternatively, the source electrode 21 and the drain electrode 22 are provided on the channel layer 12 exposed by removing a part of the electron supply layer 13, and are in contact with the vicinity of the interface between the electron supply layer 13 and the channel layer 12.

The gate electrode 23 is provided on the active region 10a of the nitride semiconductor layer 10. The gate electrode 23 is positioned between the source electrode 21 and the drain electrode 22 in the direction D1. The gate electrode 23 extends linearly with the direction D2 as the longitudinal direction. In one example, the gate electrode 23 has a laminated structure of, for example, a nickel (Ni) layer, a palladium (Pd) layer, and a gold (Au) layer. A thickness of the Ni layer is, for example, 100 nm, a thickness of the Pd layer is, for example, 50 nm, and a thickness of the Au layer is, for example, 500 nm. In addition, in another example, the gate electrode 23 has a laminated structure of, for example, a Ni layer, a platinum (Pt) layer, and a Au layer. A thickness of the Ni layer is, for example, 20 nm, a thickness of the Pt layer is, for example, 20 nm, and a thickness of the Au layer is, for example, 600 nm. The Ni layer is in Schottky contact with the nitride semiconductor layer 10.

As shown in FIG. 2, the transistor 1A further includes insulating films 31 and 32 and a back electrode 24. The insulating films 31 and 32 protect the nitride semiconductor layer 10, the source electrode 21, the drain electrode 22, and the gate electrode 23. The back electrode 24 is a metal film provided on a back surface 3b of the substrate 3. The back electrode 24 is made of a metal such as gold (Au).

The insulating film 31 is provided on the nitride semiconductor layer 10 and is in contact with the nitride semiconductor layer 10, and covers a surface 10c of the nitride semiconductor layer 10 exposed from the source electrode 21, the drain electrode 22, and the gate electrode 23. A gate opening exposing the nitride semiconductor layer 10 is provided in the insulating film 31, and a portion of the gate electrode 23 is embedded in the gate opening. The gate electrode 23 is in contact with the nitride semiconductor layer 10 through the gate opening. A length (gate length) of the gate opening in the direction D1 is, for example, 0.5 μm. The insulating film 31 is, for example, an insulating Si compound film, and is a SiN film in one example. A thickness of the insulating film 31 is, for example, 100 nm.

The insulating film 31 has an opening on the ohmic metal layer 21a of the source electrode 21, and the wiring layer 21b of the source electrode 21 is provided on the opening. The wiring layer 21b is in contact with the ohmic metal layer 21a through the opening. The insulating film 31 also has an opening on the ohmic metal layer 22a of the drain electrode 22, and the wiring layer 22b of the drain electrode 22 is provided on the opening. The wiring layer 22b is in contact with the ohmic metal layer 22a through the opening.

The insulating film 32 is provided on the insulating film 31 and is in contact with the insulating film 31. The insulating film 32 covers the source electrode 21, the drain electrode 22, the gate electrode 23, and the insulating film 31. The insulating film 32 is, for example, an insulating Si compound film, and is a SiN film in one example. A thickness of the insulating film 32 is, for example, 100 nm.

As shown in FIG. 1, the transistor 1A further includes a source pad 25, a drain pad 26, and a gate pad 27. The source pad 25, the drain pad 26, and the gate pad 27 are provided on the inactive region 10b of the nitride semiconductor layer 10. The source pad 25 and the gate pad 27 are provided on one side of the active region 10a in the direction D2, and the drain pad 26 is provided on the other side of the active region 10a in the direction D2. Therefore, the active region 10a is positioned between the source pad 25 and the gate pad 27, and between the drain pad 26 and the gate pad 27. The source pad 25, the drain pad 26, and the gate pad 27 are integrally connected to the source electrode 21, the drain electrode 22, and the gate electrode 23 extending from the active region 10a to the inactive region 10b, respectively. As a result, the pads 25 to 27 and the electrodes 21 to 23 are electrically connected to each other, respectively. The drain pad 26 and the gate pad 27 provide a region for wire bonding with external circuits.

As shown in FIG. 3, the source pad 25 includes a lower layer 25a provided on the inactive region 10b and in contact with the inactive region 10b, and an upper layer 25b provided on the lower layer 25a. The lower layer 25a is made of a metal including aluminum (Al). In one example, the lower layer 25a has the same configuration as that of the ohmic metal layer 21a of the source electrode 21. That is, the lower layer 25a is embedded in an opening 31a formed in the insulating film 31, and is formed by alloying a laminated structure of a first layer, which is a Ti layer or a Ta layer, and a second layer, which is an Al layer, by a heat treatment. The Al layer before the heat treatment may be sandwiched by the Ti layer or the Ta layer in a thickness direction of the nitride semiconductor layer 10. A thickness of the Ti layer or the Ta layer, and the Al layer is the same as that of the ohmic metal layer 21a of the source electrode 21. The upper layer 25b is a conductive metal layer having small electric resistance. The upper layer 25b is formed by, for example, Au plating, and a thickness thereof is the same as that of the wiring layer 21b of the source electrode 21. Further, a constituent material of the drain pad 26 is the same as that of the upper layer 25b. A constituent material of the gate pad 27 is the same as that of the gate electrode 23.

A via hole 4 is formed in the substrate 3 and the nitride semiconductor layer 10. The via hole 4 penetrates from the back surface 3b of the substrate 3 to the surface 10c of the nitride semiconductor layer 10. The via hole 4 is formed immediately below the source pad 25, and as seen from the thickness direction of the substrate 3 and the nitride semiconductor layer 10, the via hole 4 and the source pad 25 are overlapped with each other. A lower surface of the lower layer 25a of the source pad 25 is exposed from the substrate 3 via the via hole 4. As shown in FIG. 1, a planar shape of the via hole 4 is, for example, rectangular, circular, elliptical, or oblong.

A conductive film 24a is formed in the via hole 4. The conductive film 24a is provided on an inner surface of the via hole 4 and a lower surface of the lower layer 25a, and is in contact with the lower layer 25a. The conductive film 24a is made of the same material as that of the back electrode 24, and is connected to the back electrode 24 in the via hole 4 on the back surface 3b side. The conductive film 24a electrically connects the back electrode 24 and the source pad 25 to each other.

A method of manufacturing the transistor 1A according to the present embodiment having the above configuration will be described. FIGS. 4A to 5C are cross-sectional views showing a process of manufacturing the transistor 1A and show cross sections corresponding to FIG. 3.

Figure 4A:
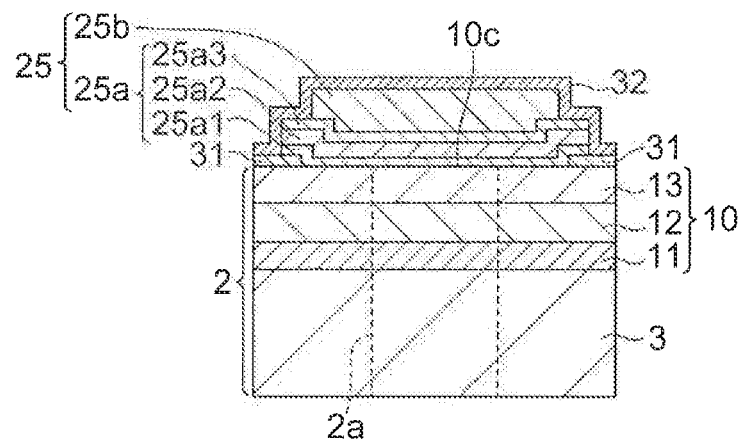
FIGS. 4A to 4C are cross-sectional views showing a process of manufacturing the transistor 1A.

First, as shown in FIG. 4A, the buffer layer 11, the channel layer 12, and the electron supply layer 13 are grown on a main surface of the substrate 3 to form the nitride semiconductor layer 10. The growth is performed, for example, by metal organic chemical vapor deposition (MOCVD). Thereby, an epitaxial substrate 2 as a substrate product including the substrate 3 and the nitride semiconductor layer 10 is formed. Next, a resist mask is formed on the region of the nitride semiconductor layer 10 serving as the active region 10a (see FIG. 1), and ions (e.g., Ar ions) are implanted into the region of the nitride semiconductor layer 10 exposed from the resist mask to form the inactive region 10b (see FIG. 1) around the active region 10a. Thereafter, the whole of the epitaxial substrate 2 is covered with the insulating film 31.

Subsequently, openings 31a are formed in the insulating film 31 corresponding to the source electrode 21, the drain electrode 22, and the source pad 25, and the openings 31a are buried with the ohmic metal layers 21a and 22a (see FIG. 2) and the lower layer 25a of the source pad 25. In this case, the lower layer 25a completely covers a via hole forming predetermined region 2a. In one example, a process of forming the lower layer 25a includes a process of forming a first layer 25a1 made of Ti or Ta on the surface of the epitaxial substrate 2, a process of forming a second layer 25a2 made of Al on the first layer 25a1, a process of forming a third layer 25a3 made of Ti or Ta on the second layer 25a2, and a process of alloying the first layer 25a1, the second layer 25a2, and the third layer 25a3 by heat treatment. The ohmic metal layers 21a and 22a are also formed in the same manner. The ohmic metal layers 21a and 22a and the lower layer 25a are formed by depositing a corresponding metal on the respective regions by, for example, vacuum deposition.

Thereafter, a gate opening is formed in the insulating film 31, and the gate opening is closed by the gate electrode 23. Through the above processes, the source electrode 21, the drain electrode 22, the lower layer 25a, and the gate electrode 23 are formed on the epitaxial substrate 2, and the epitaxial substrate 2 of which surface other than the electrode, the pad, and the metal is covered with the insulating film 31 is obtained. An edge of each of the electrodes 21 and 22, the lower layer 25a, and the gate electrode 23 may be mounted on the insulating film 31. The wiring layers 21b and 22b and the upper layer 25b are formed on the ohmic metal layers 21a and 22a and the lower layer 25a, respectively. At the same time, the drain pad 26 and the gate pad 27 are formed. Next, an insulating film 32 covering the source electrode 21, the drain electrode 22 and the insulating film 31 is formed. The formation of the wiring layers 21b and 22b, the upper layer 25b, the drain pad 26, and the gate pad 27 are performed by, for example, a plating method. The insulating films 31 and 32 are formed by, for example, chemical vapor deposition (CVD).

Figure 4B:
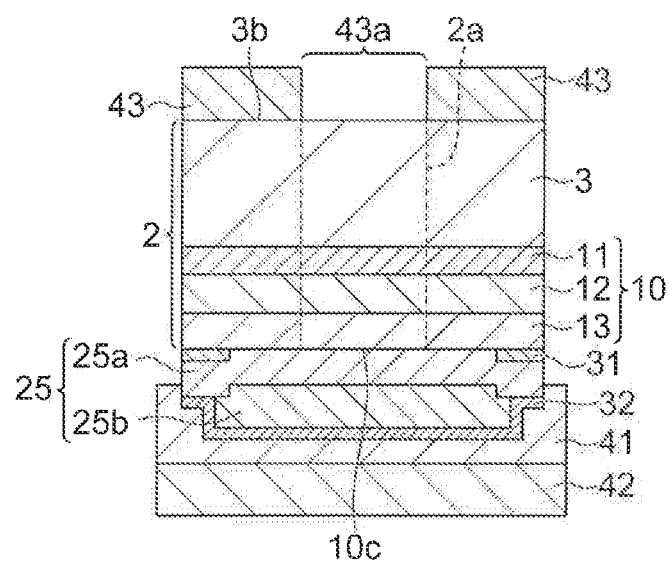

Next, as shown in FIG. 4B, the surface of the epitaxial substrate 2 on the nitride semiconductor layer 10 side (that is, the insulating film 32) and a supporting substrate 42 (e.g., a glass substrate) are adhered to each other through a wax 41. In addition, an etching mask 43 having an opening 43a in the via hole forming predetermined region 2a is formed on the back surface of the epitaxial substrate 2 (that is, the back surface 3b of the substrate 3). The etching mask 43 is made of, for example, a material including at least one of Ni and Cu, and is made of Ni in one embodiment. Specifically, first, nickel (Ni) is deposited on the back surface 3b and a resist is coated thereon. A resist pattern having an opening is formed in a portion on the via hole forming predetermined region 2a. A Ni film is etched through the opening. Thus, the etching mask 43 made of Ni and having the opening 43a is formed. Thereafter, the resist is removed.

Figure 4C:
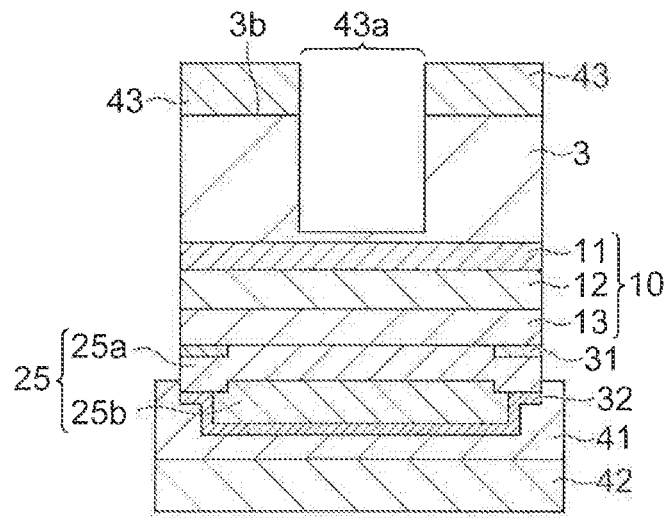

Subsequently, as shown in FIG. 4C, the substrate 3 in the via hole forming predetermined region 2a is selectively etched from the back surface 3b side through the opening 43a of the etching mask 43. The etching is reactive ion etching (RIE), which is a type of plasma etching, and uses reaction gas containing fluorine. In one example, the reaction gas is a mixed gas of $SF_6$ and $O_2$. When the substrate 3 is a SiC substrate, a chemical etching reaction (formation of silicon fluoride, $SiF_x$, and carbon dioxide ($CO_2$)) occurs due to fluorine and oxygen plasma. The RF power is, for example, 400 W. The etching is terminated in a step in which the substrate 3 remains slightly (i.e., just before the substrate 3 is completely removed). Further, the etching may be terminated in a step in which the substrate 3 is completely removed and the nitride semiconductor layer 10 is exposed.

Figure 5A:
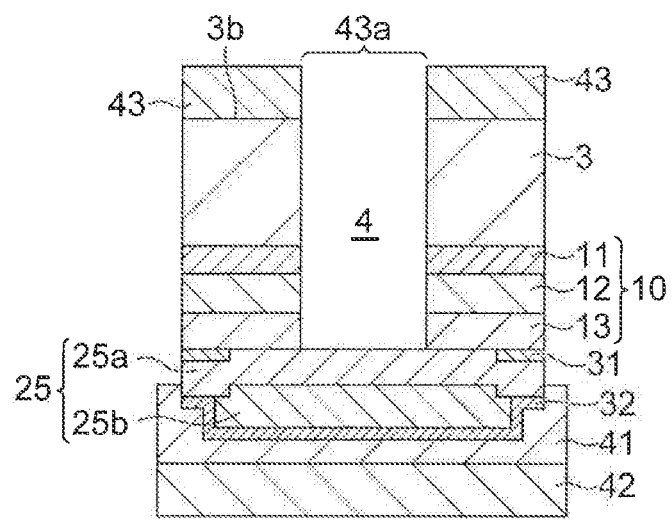
FIGS. 5A to 5C are cross-sectional views showing a process of manufacturing the transistor 1A.

Subsequently, as shown in FIG. 5A, the nitride semiconductor layer 10 is etched to expose the lower layer 25a. In such a process, the nitride semiconductor layer 10 is etched by RIE using the reaction gas containing fluorine (e.g., mixed gas of $SF_6$ and $O_2$), until the termination of the etching, continuing from the previous process, However, the RF power is set lower than the previous process. In one example, the RF power of the present process is 100 W. The RF power is changed by temporarily stopping the etching. In addition, the pressure or the like may be adjusted, if necessary. In the etching in the step, a sputter effect due to ions contained in the reaction gas (e.g., S ions) becomes dominant. Thus, the via hole 4 is formed to reach the surface from the back surface of the epitaxial substrate 2, and the lower layer 25a is exposed through the via hole 4. Further, in order to improve throughput, the nitride semiconductor layer 10 may be formed to have a thickness of 2 μm or less, for example.

Figure 5B:
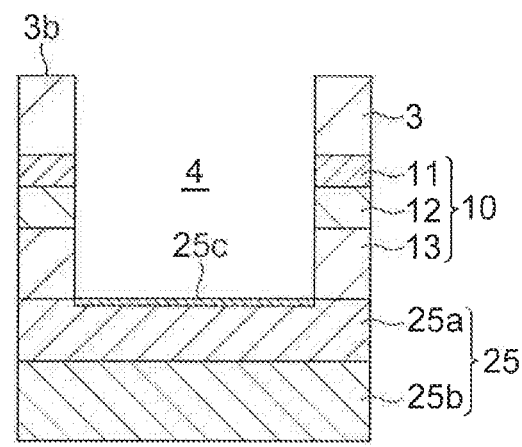

Here, as shown in FIG. 5B1, as a result of the etching, a film 25c containing aluminum fluoride $AlF_x$ and aluminum oxide $AlO_x$ is formed on the exposed surface of the lower layer 25a (in particular, on the surface of the second layer 25a2). Since the film 25c has high resistance to sputter, the progress of etching is substantially stopped. Table 1 below shows XPS analysis results of the exposed surface of the lower layer 25a. As shown in Table 1, there are many oxygen atoms and fluorine atoms in addition to aluminum atoms on the exposed surface, and $AlF_x$ and $AlO_x$ are formed on the exposed surface.

TABLE 1

|    | Carbon | Nitrogen | Oxygen | Fluorine | Aluminum | Sulfur |
|----|--------|----------|--------|----------|----------|--------|
| Al | 11.6   | 0.8      | 20.5   | 45.3     | 20.8     | 1.0    |

Figure 6:
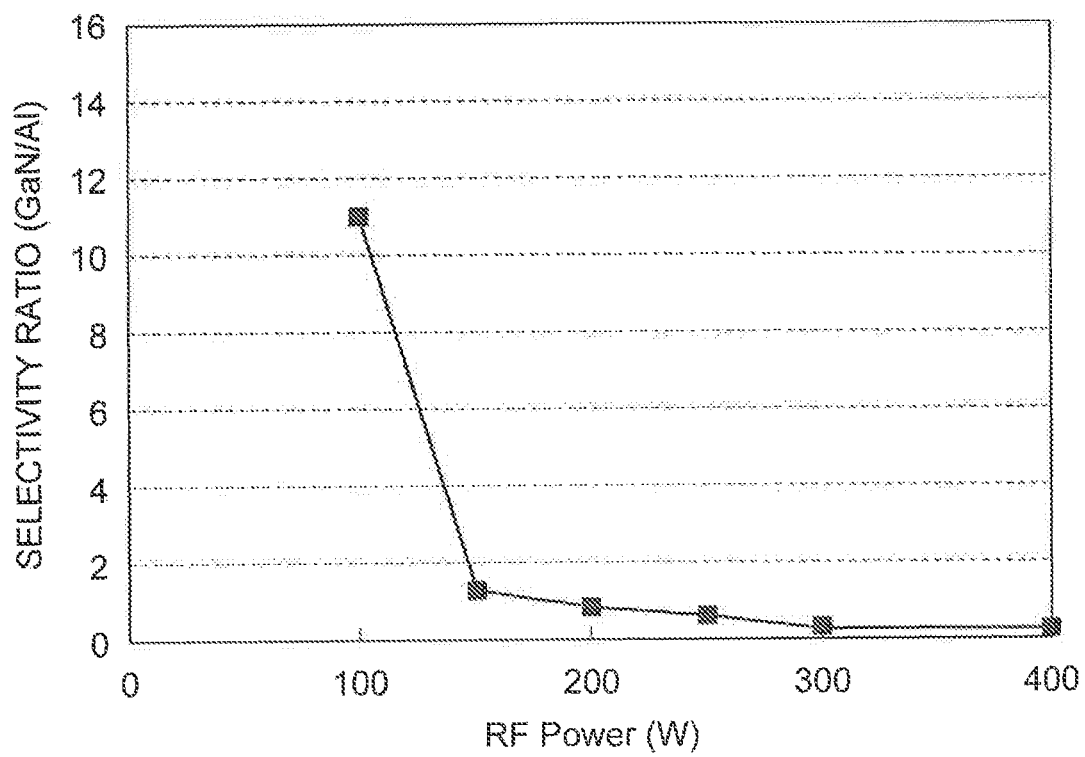
FIG. 6 is a graph showing a relationship between the etch selectivity ratio between GaN which is a nitride semiconductor and Al, and RF power when a mixed gas of $SF_6$ and $O_2$ is used as a reaction gas.

The lower layer 25a functions as an etch stopper for the nitride semiconductor layer 10. FIG. 6 is a graph showing a relationship between the etch selectivity ratio between GaN and Al, which are nitride semiconductors, and RF power when a mixed gas of $SF_6$ and $O_2$ is used as a reaction gas. A horizontal axis represents a RF power (unit: W), and a vertical axis represents an etch selectivity ratio (GaN/Al). Further, a $SF_6$ gas flow rate was 75 sccm, a $O_2$ gas flow rate was 25 sccm, and the furnace pressure was 1 Pa.

As the RF power is reduced, the etch rate decreases with GaN and Al, but since a decrease rate of GaN exceeds the decrease rate of Al, the etch selectivity ratio between GaN and Al gradually increases. In addition, in a region with low RF power (e.g., below 150 W), the etch selectivity ratio between GaN and Al increases significantly. This is because when the RF power is small, $AlF_x$ and $AlO_x$ generated on the exposed surface of the lower layer 25a become hard to be removed. In particular, when the RF power is 100 W, the etch selectivity ratio between GaN and Al exceeds 10. In the experiment, the etching (sputtering) rate of GaN was about 20 nm/min, and the etching (sputtering) rate of Al was about 2 nm/min. Therefore, the lower layer 25a containing Al can function well as an etching stopper for the nitride semiconductor layer 10.

Figure 7:
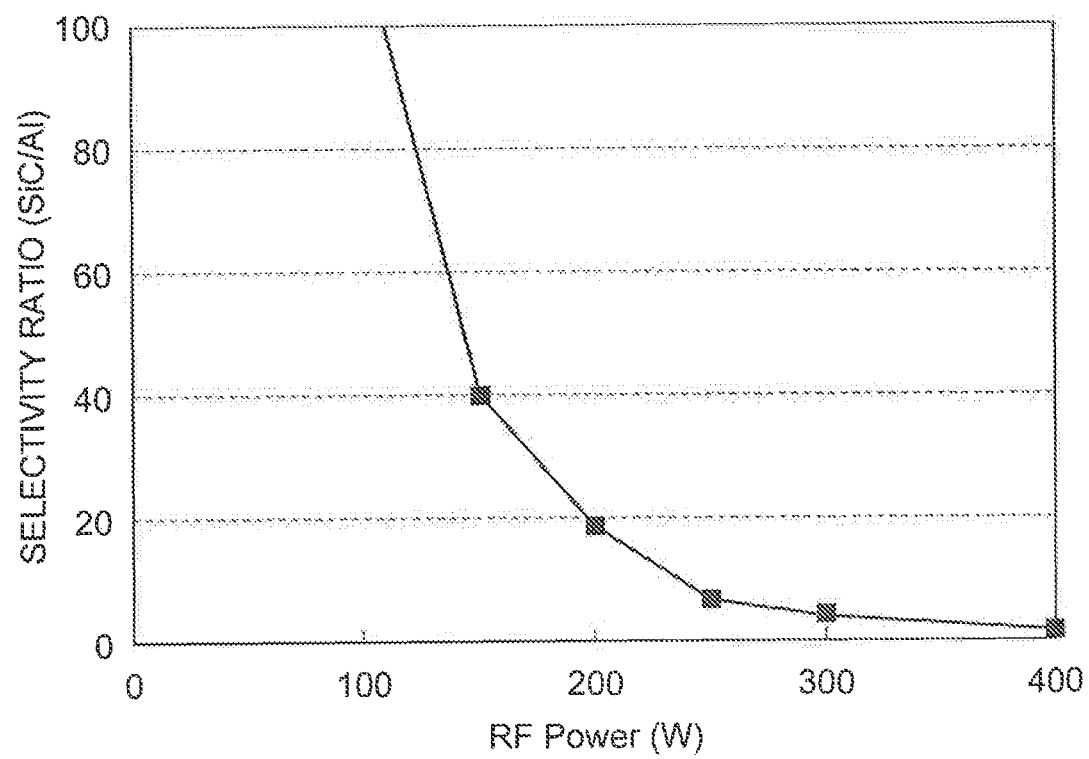
FIG. 7 is a graph showing a relationship between the etch selectivity ratio between SiC and Al and RF power when mixed gas of $SF_6$ and $O_2$ is used as a reaction gas.

FIG. 7 is a graph showing a relationship between the etch selectivity ratio between SiC and Al and RF power when mixed gas of $SF_6$ and $O_2$ is used as a reaction gas. A horizontal axis represents a RF power (unit: W), and a vertical axis represents an etch selectivity ratio (SiC/Al). The flow rates of $SF_6$ gas and $O_2$ gas and the furnace pressure are the same as in FIG. 6. As shown in FIG. 7, also in the case of SiC and Al, as the RF power is reduced, the etching rate decreases, but the etch selectivity ratio between SiC and Al gradually increases. In addition, when the RF power is 200 W, the etch selectivity ratio is close to 20, and when the RF power is 150 W, the etch selectivity ratio reaches 40. This means that the etching (sputtering) rate of SiC is much faster than the etching (sputtering) rate of GaN and Al. Therefore, even if the etching conditions for the substrate 3 are continuously maintained with respect to the nitride semiconductor layer 10 and the lower layer 25a, over etching of the lower layer 25a is less likely to occur.

The film 25c ($AlF_x$, $AlO_x$) is insulative. In order to lower electric resistance between the conductive film 24a and the lower layer 25a to be described later, the film 25c is removed after the via hole 4 is formed. For example, the film 25c can be removed by exposing the lower layer 25a exposed in the via hole 4 to plasma containing inert gas such as argon gas. After such a process, the etching mask 43 is removed.

Figure 5C:
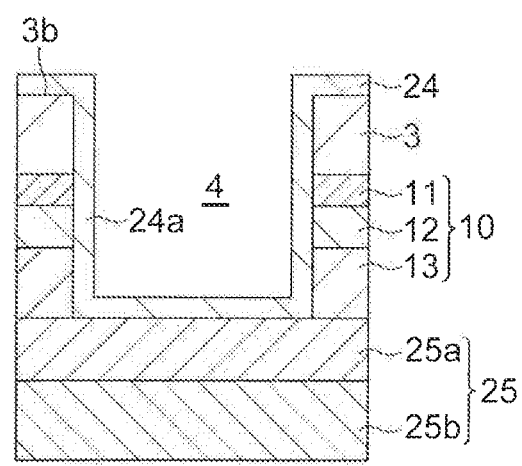

Subsequently, as shown in FIG. 5C, the back electrode 24 is formed on the back surface 3b of the substrate 3. At the same time, a conductive film 24a in contact with the lower layer 25a is formed in the via hole 4 (on the inner surface of the via hole 4 and the exposed surface of the lower layer 25a). In such a process, the back electrode 24 and the conductive film 24a are formed by Au plating, for example. Through the above processes, the transistor 1A according to the present embodiment is manufactured.

Figure 11A:
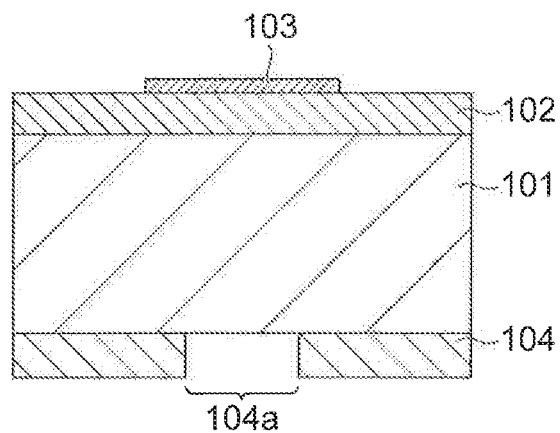
FIGS. 11A to 11C are cross-sectional views showing a conventional method of forming a via hole.

The effects obtained by the present embodiment described above will be described together with conventional problems. FIG. 11A shows a state in which a nitride semiconductor layer 102 is formed on a SiC substrate 101. The nitride semiconductor layer 102 has, for example, a GaN layer and an AlGaN layer in this order from the SiC substrate 101 side. In addition, a Ni film 103 as an etch stopper is provided on an upper surface of the nitride semiconductor layer 102. Further, on a back surface of the SiC substrate 101, an etching mask 104 having an opening 104a in a via hole forming predetermined region is provided.

Figure 11B:
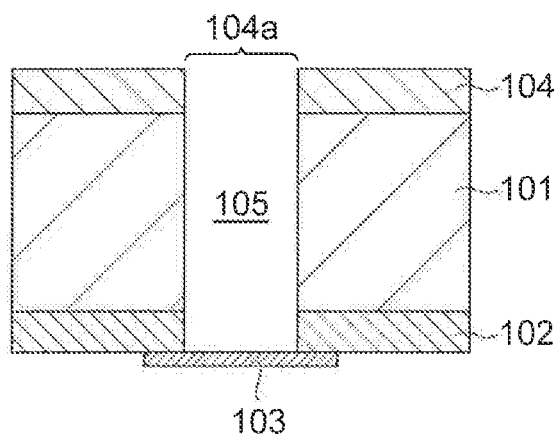
Figure 11C:
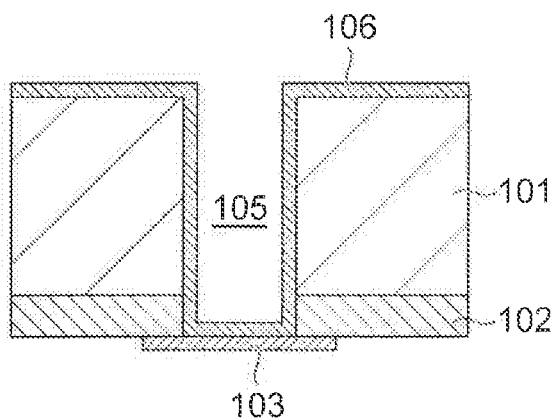

FIG. 11B shows a state in which RIE is applied to the structure shown in FIG. 11A from the back surface side of the SiC substrate 101. A via hole 105 is formed by the RIE. After the via hole 105 is formed, the etching mask 104 is removed. As reaction gas for the RIE, fluorine-based gas such as $SF_6$ is used for the SiC substrate 101, and chlorine-based gas such as $SiCl_4$ is used for the nitride semiconductor layer 102. Thereafter, as shown in FIG. 11C, a back electrode 106 is formed on the back surface of the substrate 101 and inside the via hole 105 (on an inner surface of the via hole 105 and on the Ni film 103). The back electrode 106 electrically conducts between the back surface side of the SiC substrate 101 and the Ni film 103 through the via hole 105.

Generally, the chlorine-based gas such as $SiCl_4$ is used for the RIE of the nitride semiconductor layer. For example, when etching GaN using $SiCl_4$ gas, GaN is decomposed into gallium chloride ($GaCl_2$) and nitrogen ($N_2$) by a chemical etching process. In addition, in such etching, Ni having high resistance to the chlorine-based gas is used as a material of an etching stopper. Further, Ni is changed to nickel chloride ($NiCl_2$) by irradiation with chlorine plasma, but a boiling point of NiCl$_2$ is 1000° C. or more and has sufficient resistance to the irradiation with chlorine plasmas. However, Ni has a disadvantage of high electrical resistance. As shown in FIG. 11C, when the Ni film 103 is in contact with the back electrode 106 and functions as a conductive film, the electrical resistance of the Ni film 103 may prevent the transistor from improving its electrical characteristics.

Therefore, in the present embodiment, a metal film (lower layer 25a) containing Al rather than the Ni film is used as the etching stopper. The lower layer 25a has good conductivity by mainly containing Al. Therefore, the electrical resistance between the conductive film 24a and the upper layer 25b can be suppressed to be low and the electrical characteristics of the transistor 1A can be improved. In addition, it is possible to preferably make the metal film containing Al to function as the etching stopper for the nitride semiconductor layer 10 by using a gas containing fluorine as the reaction gas for the RIE. Thus, according to the present embodiment, the electrical resistance of the metal film as the etching stopper can be reduced.

In the present embodiment, when the substrate 3 is the SiC substrate, at least a portion of the substrate 3 in the via hole forming predetermined region 2a may be etched using the reaction gas containing fluorine in the process of forming the via hole 4. SiC is efficiently etched by a chemical etching process using the reaction gas containing fluorine. Therefore, the throughput may be further improved.

In the present embodiment, the etching mask may include at least one of Ni and Cu. Since Ni and Cu have high etching resistance to fluorine-based gas, it is possible to sufficiently protect the substrate 3 except for the via hole forming predetermined region 2a.

In the present embodiment, the reaction gas containing fluorine may be a mixed gas of SF$_6$ and O$_2$. As described above, in the RIE of the nitride semiconductor layer 10 using the reaction gas containing fluorine, the nitride semiconductor layer 10 is mainly removed by the effect of sputter etching. SF$_6$ containing S (sulfur) atoms having relatively large mass is contained in the reaction gas, so that the sputter etching can be performed more effectively.

As in the present embodiment, after the process of forming the via hole 4, a process of exposing the lower layer 25a exposed in the via hole 4 to the plasma containing inert gas and a process of forming the conductive film 24a in contact with the lower layer 25a in the via hole 4 may be further performed. Thus, the insulating film 25c can be removed, and the lower layer 25a and the conductive film 24a can be conducted with low resistance.

In the present embodiment, the process of forming the lower layer 25a may include a process of forming a first layer 25a1 made of Ti or Ta on the surface of the epitaxial substrate 2, a process of forming a second layer 25a2 made of Al on the first layer 25a1, and a process of alloying the first layer 25a1 and the second layer 25a2. As a result, since the lower layer 25a as the etching stopper can be formed in the same process as the ohmic metal layers 21a and 22a, only a process for forming the etching stopper is unnecessary and the number of processes can be reduced.

First Modified Example

FIGS. 8A to 8C are cross-sectional views showing a manufacturing process according to a first modified example of the embodiment. In the present modified example, as shown in FIG. 8A, the substrate 3 in the via hole forming predetermined region 2a is selectively etched from the back surface 3b side through the opening 43a of the etching mask 43. In addition, the etching is terminated in a step in which the substrate 3 remains slightly (i.e., just before the substrate 3 is completely removed). The process is the same as the process shown in FIG. 4C of the embodiment.

Next, as shown in FIG. 8B, the nitride semiconductor layer 10 in the via hole forming predetermined region 2a is etched through the opening 43a of the etching mask 43. In such a process, the reaction gas is changed from the reaction gas containing fluorine in the previous process (e.g., mixed gas of SF$_6$ and O$_2$) to a reaction gas containing chlorine (e.g., example, Cl$_2$ gas), and the nitride semiconductor layer 10 is etched by RIE. The RF power is, for example, 50 W. In addition, the etching is terminated in a step in which the nitride semiconductor layer 10 remains slightly (i.e., just before the nitride semiconductor layer 10 is completely removed). At this time, the termination of the etching can be determined by plasma emission derived from Al. That is, a remaining part of the substrate 3 is first etched by the etching gas containing chlorine, and the light emitted by Al contained in the AlN buffer layer 11 is then detected. If the etching continues, the Al emission disappears when the etching of the AlN buffer layer 11 is terminated. At this time, the etching has already reached the GaN channel layer 12, and if the etching continues, the emission of Al is detected again when the etching of the GaN channel layer 12 is terminated, that is, when the AlGaN barrier layer 13 is exposed. When the second emission of Al is detected, the etching is stopped.

Subsequently, the reaction gas is changed again from the reaction gas containing chlorine (e.g., Cl$_2$ gas) to the reaction gas containing fluorine (e.g., mixed gas of SF$_6$ and O$_2$), and the remaining part of the nitride semiconductor layer 10 is etched. The reaction gas containing fluorine is used during the period including the termination of the etching, particularly, to etch the AlGaN barrier layer 13. The RF power is, for example, 100 W. Through such a process, as shown in FIG. 8C, the via hole 4 is formed to reach the surface from the back surface of the epitaxial substrate 2, and the lower layer 25a is exposed through the via hole 4. Thereafter, the transistor 1A is manufactured through the processes shown in FIGS. 5B and 5C of the embodiment.

In the present modified example, a portion of the nitride semiconductor layer 10 in the via hole forming predetermined region 2a may be etched using the reaction gas containing chlorine, and thereafter, the remaining portion of the nitride semiconductor layer 10 in the via hole forming predetermined region 2a may be etched using the reaction gas containing fluorine. In this case, the nitride semiconductor layer 10 can be efficiently etched by a chemical etching process. Therefore, the throughput may be further improved. In addition, the function of the lower layer 25a as the etching stopper can be exerted satisfactorily by changing the reaction gas to the gas containing fluorine during the period including the termination of the etching. When the nitride semiconductor layer 10 has a thickness of, for example, 1 μm or more, the method of the present modified example is particularly effective.

Second Modified Example

Figure 9:
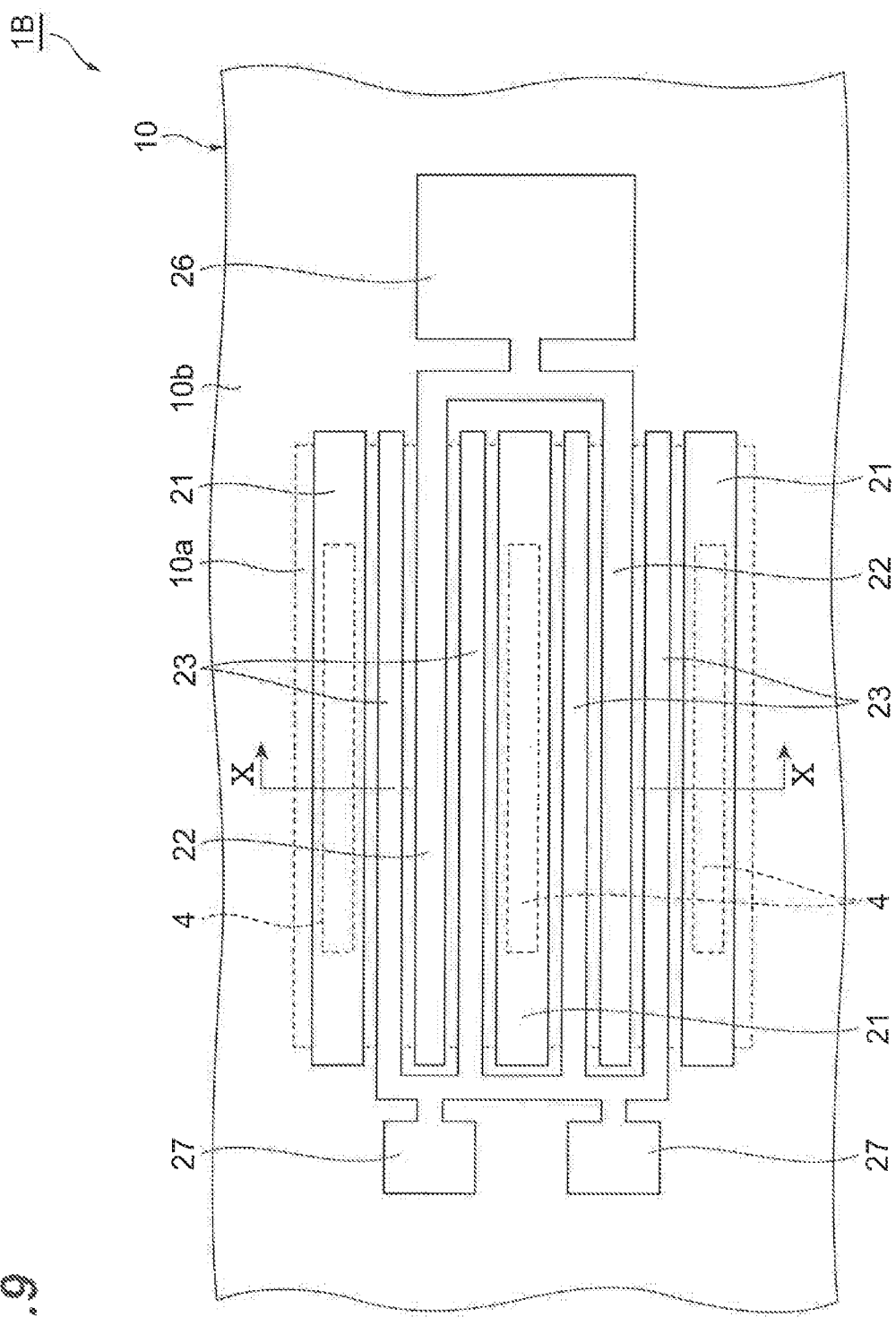
FIG. 9 is a plan view showing a transistor 1B as a semiconductor device according to a second modified example of the embodiment.

FIG. 9 is a plan view showing a transistor 1B as a semiconductor device according to a second modified example of the embodiment. FIG. 10 is a cross-sectional view taken along the line X-X of the transistor 1B shown in FIG. 9. Further, for the sake of explanation, the insulating films 31 and 32 are omitted in FIG. 9.

A difference between the present modified example and the embodiment is the formation position of the via hole. In the embodiment, the via hole 4 is formed in the inactive region 10b immediately below the source pad 25, whereas in the present modified example, the via hole 4 is formed in the active region 10a immediately below the source electrode 21. In addition, the conductive film 24a provided inside the via hole 4 is not in contact with the source pad 25 but is in contact with the ohmic metal layer 21a of the source electrode 21. Such a structure is referred to as an island source via-hall (ISV) structure. In such a structure, the source pad 25 shown in FIG. 1 is not necessary. Further, other configurations except for the formation position of the via hole and the presence or absence of the source pad 25 are the same as in the embodiment.

When a transistor 1B of the present modified example is manufactured, the ohmic metal layer 21a can be used as the etching stopper. Since the structure of the ohmic metal layer 21a is the same as that of the lower layer 25a of the embodiment, the ohmic metal layer 21a can function as the etching stopper when the via hole 4 is formed by RIE. Further, the method of forming the via hole 4 is the same as that of the embodiment.

According to the present modified example, since the ohmic metal layer 21a containing Al is used as the etching stopper, it is not necessary to separately form the etching stopper, and the process can be shortened. In a case where a layer functioning as the etching stopper is formed separately from the ohmic metal layer 21a, the etching stopper needs to be formed outside the ohmic metal layer 21a. In the present modified example, however, it is not necessary to form the etching stopper outside the ohmic metal layer 21a, which contributes to the reduction of the via hole 4. An edge region in contact with the gate electrode functions exclusively as the ohmic metal layer 21a. Therefore, the via hole 4 can be formed in the source electrode of the transistor in accordance with the arrangement of the electrode of the conventional transistor.

The method of manufacturing a semiconductor device according to the present disclosure is not limited to the embodiments described above, and various other variations are possible. For example, the embodiments and modified example described above may be combined with each other in accordance with the necessary purposes and effects. In addition, in the embodiments described, $SF_6$ is illustrated as the reaction gas containing fluorine, but the reaction gas containing fluorine is not limited to thereto, and for example, $CF_4$, $NF_3$ and the like can be used.

What is claimed is:

1. A method of manufacturing a semiconductor device, comprising:
    forming a metal film containing Al on a surface of a substrate product including a substrate and a nitride semiconductor layer on the substrate, the metal film covering a via hole forming predetermined region, and the surface of the substrate product being located on the nitride semiconductor layer side;
    forming an etching mask having an opening for exposing the via hole forming predetermined region on a back surface of the substrate product, the back surface of the substrate product being located on the substrate side;
    forming a via hole in the substrate product by reactive ion etching, the via hole reaching the surface from the back surface and exposing the metal film;
    forming an etch stopper film containing aluminum fluoride and aluminum oxide on the exposed metal film; and
    removing the etch stopper film on the exposed metal film,
    wherein, in the forming the via hole, a reaction gas containing fluorine is used during a period at least including a termination of etching.

2. The method of manufacturing a semiconductor device according to claim 1,
    wherein the substrate is a SiC substrate, and
    wherein, in the forming the via hole, at least a portion of the SiC substrate in the via hole forming predetermined region is etched using the reaction gas containing fluorine.

3. The method of manufacturing a semiconductor device according to claim 1,
    wherein the etching mask contains at least one of Ni and Cu.

4. The method of manufacturing a semiconductor device according to claim 1,
    wherein the reaction gas containing fluorine is a mixed gas of $SF_6$ and $O_2$.

5. The method of manufacturing a semiconductor device according to claim 1,
    wherein, in the forming the via hole, the nitride semiconductor layer in the via hole forming predetermined region is etched using the reaction gas containing fluorine.

6. The method of manufacturing a semiconductor device according to claim 1,
    wherein, in the forming the via hole, a portion of the nitride semiconductor layer in the via hole forming predetermined region is etched using a reaction gas containing chlorine, and the remaining portion of the nitride semiconductor layer in the via hole forming predetermined region is then etched using the reaction gas containing fluorine.

7. The method of manufacturing a semiconductor device according to claim 1, further comprising:
    after the forming the via hole, exposing the metal film exposed in the via hole to plasma containing an inert gas.

8. The method of manufacturing a semiconductor device according to claim 7, wherein the inert gas includes argon gas.

9. The method of manufacturing a semiconductor device according to claim 1, wherein the forming the metal film includes:
    forming a first layer made of Ti or Ta on the surface of the substrate product;
    forming a second layer made of Al on the first layer; and
    alloying the first layer and the second layer.

* * * * *